United States Patent
Takahashi et al.

(10) Patent No.: US 8,054,699 B2
(45) Date of Patent: Nov. 8, 2011

(54) SEMICONDUCTOR MEMORY DEVICE HAVING A DOUBLE BRANCHING BIDIRECTIONAL BUFFER

(75) Inventors: Susumu Takahashi, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 555 days.

(21) Appl. No.: 12/289,349

(22) Filed: Oct. 27, 2008

(65) Prior Publication Data
US 2009/0109767 A1    Apr. 30, 2009

(30) Foreign Application Priority Data
Oct. 26, 2007   (JP) .................................. 2007-279708

(51) Int. Cl.
*G11C 7/10*   (2006.01)

(52) U.S. Cl. ......... 365/189.18; 365/189.17; 365/189.14; 365/189.05; 365/189.08; 365/233.19; 365/233.13; 365/233.1; 365/230.03

(58) Field of Classification Search ............. 365/233.13, 365/233.16, 233.17, 233.19, 233.1, 230.03, 365/189.05, 189.14, 189.17, 189.18, 189.08
See application file for complete search history.

(56) References Cited

U.S. PATENT DOCUMENTS

| | | | |
|---|---|---|---|
| 6,181,609 B1 * | 1/2001 | Muraoka | 365/189.05 |
| 6,633,179 B1 | 10/2003 | Nakata | |
| 6,857,039 B1 | 2/2005 | Makino | |
| 6,928,006 B2 * | 8/2005 | Park | 365/189.11 |
| 7,765,019 B2 * | 7/2010 | Sinai | 700/94 |
| 2003/0043682 A1 | 3/2003 | Usuki et al. | |
| 2009/0109767 A1 * | 4/2009 | Takahashi et al. | 365/189.18 |

FOREIGN PATENT DOCUMENTS

| | | |
|---|---|---|
| JP | 2001-102914 | 4/2001 |
| JP | 2001-188638 | 7/2001 |
| JP | 2003-77276 | 3/2003 |

* cited by examiner

*Primary Examiner* — Andrew Q Tran
(74) *Attorney, Agent, or Firm* — McGinn IP Law Group, PLLC

(57) ABSTRACT

A semiconductor memory device includes a memory cell array divided into a plurality of areas, a common data bus connected to an input/output circuit, a plurality of individual data buses connected to different areas of the memory cell array through different paths respectively, and a bidirectional buffer connected to the common data bus and the individual data buses. In the semiconductor memory device, the bidirectional buffers transmit data bidirectionally between the common data bus and a selected one of the individual data buses.

12 Claims, 22 Drawing Sheets

FIG.3

FIRST EMBODIMENT (WRITE OPERATION : BANK SELECTION)

| SELECTED BANK | BUS CONDITION | X14 | NR2 | NR1 | NW2 | NW1 |
|---|---|---|---|---|---|---|
| 0 | BS1 (X14=0) | 0 | 0 | 0 | 0 | 1 |
|   |              | 1 | 0 | 0 | 0 | 0 |
|   | BS1 (X14=1) | * | 0 | 0 | 0 | 0 |
|   | BS2 (X14=0) | * | 0 | 0 | 0 | 0 |
|   | BS2 (X14=1) | 0 | 0 | 0 | 0 | 0 |
|   |              | 1 | 0 | 0 | 1 | 0 |
| 1 | BS1 (X14=0) | 0 | 0 | 0 | 0 | 1 |
|   |              | 1 | 0 | 0 | 0 | 0 |
|   | BS1 (X14=1) | 0 | 0 | 0 | 0 | 0 |
|   |              | 1 | 0 | 0 | 0 | 1 |
|   | BS2 (X14=0) | * | 0 | 0 | 0 | 0 |
|   | BS2 (X14=1) | * | 0 | 0 | 0 | 0 |
| 6 | BS1 (X14=0) | * | 0 | 0 | 0 | 0 |
|   | BS1 (X14=1) | * | 0 | 0 | 0 | 0 |
|   | BS2 (X14=0) | 0 | 0 | 0 | 1 | 0 |
|   |              | 1 | 0 | 0 | 0 | 0 |
|   | BS2 (X14=1) | 0 | 0 | 0 | 0 | 0 |
|   |              | 1 | 0 | 0 | 1 | 0 |
| 7 | BS1 (X14=0) | * | 0 | 0 | 0 | 0 |
|   | BS1 (X14=1) | * | 0 | 0 | 0 | 0 |
|   | BS2 (X14=0) | 0 | 0 | 0 | 1 | 0 |
|   |              | 1 | 0 | 0 | 0 | 0 |
|   | BS2 (X14=1) | 0 | 0 | 0 | 0 | 0 |
|   |              | 1 | 0 | 0 | 1 | 0 |

FIG.4

FIRST EMBODIMENT (READ OPERATION : BANK SELECTION)

| SELECTED BANK | BUS CONDITION | X14 | NR2 | NR1 | NW2 | NW1 |
|---|---|---|---|---|---|---|
| 0 | BS1 (X14=0) | 0 | 0 | 1 | 0 | 0 |
| | | 1 | 0 | 0 | 0 | 0 |
| | BS1 (X14=1) | * | 0 | 0 | 0 | 0 |
| | BS2 (X14=0) | * | 0 | 0 | 0 | 0 |
| | BS2 (X14=1) | 0 | 0 | 0 | 0 | 0 |
| | | 1 | 1 | 0 | 0 | 0 |
| 1 | BS1 (X14=0) | 0 | 0 | 1 | 0 | 0 |
| | | 1 | 0 | 0 | 0 | 0 |
| | BS1 (X14=1) | 0 | 0 | 0 | 0 | 0 |
| | | 1 | 0 | 1 | 0 | 0 |
| | BS2 (X14=0) | * | 0 | 0 | 0 | 0 |
| | BS2 (X14=1) | * | 0 | 0 | 0 | 0 |
| 6 | BS1 (X14=0) | * | 0 | 0 | 0 | 0 |
| | BS1 (X14=1) | * | 0 | 0 | 0 | 0 |
| | BS2 (X14=0) | 0 | 1 | 0 | 0 | 0 |
| | | 1 | 0 | 0 | 0 | 0 |
| | BS2 (X14=1) | 0 | 0 | 0 | 0 | 0 |
| | | 1 | 1 | 0 | 0 | 0 |
| 7 | BS1 (X14=0) | * | 0 | 0 | 0 | 0 |
| | BS1 (X14=1) | * | 0 | 0 | 0 | 0 |
| | BS2 (X14=0) | 0 | 1 | 0 | 0 | 0 |
| | | 1 | 0 | 0 | 0 | 0 |
| | BS2 (X14=1) | 0 | 0 | 0 | 0 | 0 |
| | | 1 | 1 | 0 | 0 | 0 |

FIG.6

FIRST EMBODIMENT
TRUTH TABLE OF DOUBLE BRANCHING BIDIRECTIONAL BUFFERS (WRITE OPERATION)

| CONTROL SIGNAL | | | | DATA BUS | | |
|---|---|---|---|---|---|---|
| NR2 | NR1 | NW2 | NW1 | BS0 | BS2 | BS1 |
| 0 | 0 | 0 | 0 | 0 | Z | Z |
| 0 | 0 | 0 | 0 | 1 | Z | Z |
| 0 | 0 | 0 | 1 | 0 | Z | 0 |
| 0 | 0 | 0 | 1 | 1 | Z | 1 |
| 0 | 0 | 1 | 0 | 0 | 0 | Z |
| 0 | 0 | 1 | 0 | 1 | 1 | Z |
| 0 | 0 | 1 | 1 | 0 | 0 | 0 |
| 0 | 0 | 1 | 1 | 1 | 1 | 1 |

Z : HIGH IMPEDANCE

FIG.7

FIRST EMBODIMENT
TRUTH TABLE OF DOUBLE BRANCHING BIDIRECTIONAL BUFFERS (READ OPERATION)

| CONTROL SINGNAL | | | | DATA BUS | | |
|---|---|---|---|---|---|---|
| NW2 | NW1 | NR2 | NR1 | BS2 | BS1 | BS0 |
| 0 | 0 | 0 | 0 | 0 | 0 | Z |
| 0 | 0 | 0 | 0 | 0 | 1 | Z |
| 0 | 0 | 0 | 0 | 1 | 0 | Z |
| 0 | 0 | 0 | 0 | 1 | 1 | Z |
| 0 | 0 | 0 | 1 | 0 | 0 | 0 |
| 0 | 0 | 0 | 1 | 0 | 1 | 1 |
| 0 | 0 | 0 | 1 | 1 | 0 | 0 |
| 0 | 0 | 0 | 1 | 1 | 1 | 1 |
| 0 | 0 | 1 | 0 | 0 | 0 | 0 |
| 0 | 0 | 1 | 0 | 0 | 1 | 0 |
| 0 | 0 | 1 | 0 | 1 | 0 | 1 |
| 0 | 0 | 1 | 0 | 1 | 1 | 1 |
| 0 | 0 | 1 | 1 | 0 | 0 | $\alpha$ |
| 0 | 0 | 1 | 1 | 0 | 1 | $\alpha$ |
| 0 | 0 | 1 | 1 | 1 | 0 | $\alpha$ |
| 0 | 0 | 1 | 1 | 1 | 1 | $\alpha$ |

Z : HIGH IMPEDANCE
$\alpha$ : HIGH IMPEDANCE OR SIGNAL OF BS1/BS2

| SELECTED BANK | X14 | NR1 | NR2 |
|---|---|---|---|
| 0 | 0 | 0 | 1 |
|   | 1 | 1 | 0 |
| 1 | 0 | 1 | 0 |
|   | 1 | 1 | 0 |
| 6 | 0 | 0 | 1 |
|   | 1 | 0 | 1 |
| 7 | 0 | 0 | 1 |
|   | 1 | 0 | 1 |
| ET CETERA | 0 | 0 | 0 |
|   | 1 | 0 | 0 |

FIG.11

SECOND EMBODIMENT (WRITE OPERATION : BANK SELECTION)

| SELECTED BANK | INDIVIDUAL DATA BUS | NR2 | NR1 | NW2 | NW1 |
|---|---|---|---|---|---|
| 0 | BS1 | 0 | 0 | 0 | 1 |
|   | BS2 | 0 | 0 | 1 | 0 |
| 0 (PRIORITY ORDER SET) | BS1 | 0 | 0 | 1 | 1 |
|   | BS2 | 0 | 0 | 1 | 1 |
| 1 | BS1 | 0 | 0 | 0 | 1 |
|   | BS2 | 0 | 0 | 0 | 0 |
| 6 | BS1 | 0 | 0 | 0 | 0 |
|   | BS2 | 0 | 0 | 1 | 0 |
| 7 | BS1 | 0 | 0 | 0 | 0 |
|   | BS2 | 0 | 0 | 1 | 0 |

FIG.12

SECOND EMBODIMENT (READ OPERATION : BANK SELECTION)

| SELECTED BANK | INDIVIDUAL DATA BUS | NR2 | NR1 | NW2 | NW1 |
|---|---|---|---|---|---|
| 0 | BS1 | 1 | 0 | 0 | 0 |
|   | BS2 | 0 | 1 | 0 | 0 |
| 0 (PRIORITY ORDER SET) | BS1 | 1 | 1 | 0 | 0 |
|   | BS2 | 1 | 1 | 0 | 0 |
| 1 | BS1 | 0 | 1 | 0 | 0 |
|   | BS2 | 0 | 0 | 0 | 0 |
| 6 | BS1 | 0 | 0 | 0 | 0 |
|   | BS2 | 1 | 0 | 0 | 0 |
| 7 | BS1 | 0 | 0 | 0 | 0 |
|   | BS2 | 1 | 0 | 0 | 0 |

FIG.13

SECOND EMBODIMENT
TRUTH TABLE OF DOUBLE BRANCHING BIDIRECTIONAL BUFFERS (READ OPERATION)

| CONTROL SIGNAL | | | | DATA BUS | | |
|---|---|---|---|---|---|---|
| NW2 | NW1 | NR2 | NR1 | BS2 | BS1 | BS0 |
| 0 | 0 | 0 | 0 | 0 | 0 | Z |
| 0 | 0 | 0 | 0 | 0 | 1 | Z |
| 0 | 0 | 0 | 0 | 1 | 0 | Z |
| 0 | 0 | 0 | 0 | 1 | 1 | Z |
| 0 | 0 | 0 | 1 | 0 | 0 | 0 |
| 0 | 0 | 0 | 1 | 0 | 1 | 1 |
| 0 | 0 | 0 | 1 | 1 | 0 | 0 |
| 0 | 0 | 0 | 1 | 1 | 1 | 1 |
| 0 | 0 | 1 | 0 | 0 | 0 | 0 |
| 0 | 0 | 1 | 0 | 0 | 1 | 0 |
| 0 | 0 | 1 | 0 | 1 | 0 | 1 |
| 0 | 0 | 1 | 0 | 1 | 1 | 1 |
| 0 | 0 | 1 | 1 | 0 | 0 | 0 |
| 0 | 0 | 1 | 1 | 0 | 1 | 0 |
| 0 | 0 | 1 | 1 | 1 | 0 | 1 |
| 0 | 0 | 1 | 1 | 1 | 1 | 1 |

Z : HIGH IMPEDANCE

| SELECTED BANK | NR1a | NR2a |
|---|---|---|
| 0 (I/O 4~7) | 1 | 0 |
| 1 (I/O 4~7) | 1 | 0 |
| 6 (I/O 4~7) | 0 | 1 |
| 7 (I/O 4~7) | 0 | 1 |
| ET CETERA | 0 | 0 |

| SELECTED BANK | NR1b | NR2b |
|---|---|---|
| 0 (I/O 0~3) | 0 | 1 |
| 1 (I/O 0~3) | 1 | 0 |
| 6 (I/O 0~3) | 0 | 1 |
| 7 (I/O 0~3) | 0 | 1 |
| ET CETERA | 0 | 0 |

| SELECTED BANK | NR1 | NR1 |
|---|---|---|
| 0 | 1 | 1 |
| 1 | 1 | 0 |
| 6 | 0 | 1 |
| 7 | 0 | 1 |
| ET CETERA | 0 | 0 |

COMPLEX LOGIC SELECTION BUFFER <CONFIGURATION A>

NR1=1, NR2=1 → BS2 GIVEN PRIORITY

COMPLEX LOGIC SELECTION BUFFER <CONFIGURATION B>

NR1=1, NR2=1 → BS1 GIVEN PRIORITY

FIG.19

SECOND EMBODIMENT
RELATION BETWEEN I/O PORTS AND THE COMPLEX LOGIC SELECTION BUFFER

| I/O | CONFIGURATION A | CONFIGURATION B | DATA TRANSFER DIRECTION |
|---|---|---|---|
| 0 | ○ |   | BS2<I/O0> → BS0<I/O0> |
| 1 | ○ |   | BS2<I/O1> → BS0<I/O1> |
| 2 | ○ |   | BS2<I/O2> → BS0<I/O2> |
| 3 | ○ |   | BS2<I/O3> → BS0<I/O3> |
| 4 |   | ○ | BS1<I/O4> → BS0<I/O4> |
| 5 |   | ○ | BS1<I/O5> → BS0<I/O5> |
| 6 |   | ○ | BS1<I/O6> → BS0<I/O6> |
| 7 |   | ○ | BS1<I/O7> → BS0<I/O7> |

FIG.22A

| NR0a | NR5 | NR6 | NODE Nd |
|---|---|---|---|
| 0 | 0 | 0 | BS0a |
| 0 | 0 | 1 | BS6 |
| 0 | 1 | 0 | BS5 |
| 0 | 1 | 1 | BS5 |
| 1 | 0 | 0 | BS0a |
| 1 | 0 | 1 | BS6 |
| 1 | 1 | 0 | BS5 |
| 1 | 1 | 1 | BS5 |

FIG.22B

| THIRD PRIORITY | FIRST PRIORITY | SECOND PRIORITY | |
|---|---|---|---|
| NR0a | NR5 | NR6 | DATA TRANSFER DIRECTION |
| 0 | 0 | 0 | - |
| 0 | 0 | 1 | BS6 → BS0b |
| 0 | 1 | 0 | BS5 → BS0b |
| 0 | 1 | 1 | BS5 → BS0b |
| 1 | 0 | 0 | BS0a → BS0b |
| 1 | 0 | 1 | BS6 → BS0b |
| 1 | 1 | 0 | BS5 → BS0b |
| 1 | 1 | 1 | BS5 → BS0b |

SEMICONDUCTOR MEMORY DEVICE HAVING A DOUBLE BRANCHING BIDIRECTIONAL BUFFER

BACKGROUND OF THE INVENTION

1. Field of the Invention

The present invention relates to a semiconductor memory device which transmits data between a memory area for storing data and outside through a data bus, and particularly relates to a semiconductor memory device having a bus configuration in which a bidirectional buffer for buffering data transmitted bidirectionally through the data bus is provided so as to shorten wiring length.

2. Description of Related Art

In recent years, as semiconductor memory devices have been highly integrated, high-speed data transfer rate has been required, and wiring length of a data bus for transmitting data of a memory cell array has been increased. Wiring capacitance and resistance of the data bus increase due to the increase in the wiring length of the data bus, thereby causing delays in data transmission, and it becomes difficult to ensure high-speed data transfer rate.

As measures against the increase in the wiring length of the data bus, a configuration has been proposed in which the data bus is divided and a bidirectional buffer is inserted therebetween (for example, see Patent References 1 and 2). By providing the bidirectional buffer, the wiring length of the data bus can be shortened while both write and read data are transmitted, and data transfer rate can be increased. Further, a memory cell array divided into a plurality of banks has been employed in recent semiconductor memory devices, and a configuration has been proposed in which the bidirectional buffer is inserted in a data bus configuration connected to the plurality of banks (for example, see Patent Reference 3).

Patent Reference 1: Laid-open Japanese Patent Publication No. 2001-102914

Patent Reference 2: Laid-open Japanese Patent Publication No. 2001-188638

Patent Reference 3: Laid-open Japanese Patent Publication No. 2003-077276

However, as the storage capacity of semiconductor memory devices has been increased, the number of wirings of the data bus is remarkably increased since a large number of lines for inputting/outputting data for the memory cell array need to be bundled, as well as the increase in the wiring length of the data bus. Thus, an area required for the wirings in a semiconductor chip increases, and consumption current inevitably increases due to the increase in the number of circuit elements in an input/output circuit. For example, if the configuration disclosed in the above conventional patent references 1 and 2 is employed, only the wiring length of the data bus can be shortened, while the number of wirings of the data bus connected through the bidirectional buffer cannot be reduced. Further, in the configuration of the above conventional patent reference 3, transmission data of the data bus connected to the plurality of banks is inputted to the bidirectional buffer, however this configuration is limited to a case where connection forms between the respective banks and the data bus are symmetrical and uniform. Therefore, it is not possible to selectively buffer the transmission data of the plurality of data buses connected to a desired bank through a desired path. Further, in a configuration where each bank is partitioned into areas, it is not assumed that there exist a bank having areas connected to the same data bus and a bank having areas connected to different data buses. As described above, when employing the data bus configuration capable of shortening the wiring length in the conventional semiconductor memory device, there is a problem that it is difficult to selectively buffer transmission data through many data buses connected to different areas in the memory cell array with various paths.

SUMMARY

The present invention seeks to solve the above problem and provides a semiconductor memory device in which high-speed data transfer time is ensured by shortening wiring length of a data bus. Thereby, a plurality of individual data buses connected to different areas of a memory cell array are provided in any arrangement, and data transmitted bidirectionally between a common data bus and the individual data buses can be selectively buffered, in order to reduce both chip area required for wiring and consumption current.

In one of aspects of the invention, there is provided a semiconductor memory device having a memory cell array divided into a plurality of areas, a common data bus connected to an input/output circuit, a plurality of individual data buses connected to different areas of said memory cell array through different paths respectively, and a bidirectional buffer connected to said common data bus and a predetermined number of said individual data buses and buffering data transmitted bidirectionally between said common data bus and a selected one of the predetermined number of said individual data buses.

According to the semiconductor memory device of the present invention, since the memory cell array and the input/output circuit are connected through the plurality of individual data buses and the common data bus and divided by the bidirectional buffer, high-speed data transfer time can be obtained by shortening overall wiring length of the data buses. Then, in a write operation, write data from the input/output circuit is transmitted through the common data bus and buffered in the bidirectional buffer, and thereafter inputted to a predetermined area of the memory cell array through a certain individual data bus. Meanwhile, in a read operation, read data of the memory cell array is transmitted through a certain individual data bus and selectively buffered in the bidirectional buffer, and thereafter outputted to outside from the input/output circuit through the common data bus. Thus, a large number of individual data buses having various paths suitable for the area division of the memory cell array can be arranged, and since transmission data thereof can be commonly transmitted through the common data bus by the operation of the bidirectional buffer, the number of wirings of the common data bus is reduced and the number of circuit elements of the input/output circuit can be reduced.

In the present invention, said common data bus may include a plurality of signal lines extending in a first direction, and each of said individual data buses includes a plurality of signal lines extending in a second direction orthogonal to the first direction. Further, said bidirectional buffer may be a double branching bidirectional buffer for buffering data transmitted bidirectionally between a selected one of the first and second individual data buses and said common data bus.

As described above, according to the present invention, a common data bus connected to an input/output circuit is provided and a bidirectional circuit is provided between a plurality of individual data buses connected to respective areas of a memory cell array, and therefore data transmitted bidirectionally between the common data bus and the plurality of individual data buses can be selectively buffered, in addition to preventing a delay in data transmission by shortening wiring length in a data bus configuration of a highly integrated semiconductor memory device. Thereby, when the plurality of individual data buses having different paths and different directions are connected to different areas of the memory cell array, they can selectively share the common data bus, and therefore a reduction in the number of wirings and a reduction in the circuit scale of the input/output circuit can be achieved. Thus, an increase in the chip area of the semiconductor memory device can be suppressed, and the consumption current can be reduced.

Further, even when the memory cell array is divided into a plurality of banks and two areas in the same bank are connected to the individual data buses different from each other, a desired individual data bus can be properly connected to the common data bus by the operation of the bidirectional buffer. In this case, even if no address information is given to each area in the bank, desired transmission data can be buffered in the bidirectional buffer by setting the priority order for the plurality of individual data buses.

BRIEF DESCRIPTION OF THE DRAWINGS

The above featured and advantages of the present invention will be more apparent from the following description of certain preferred embodiments taken in conjunction with the accompanying drawings, in which:

FIG. 3 is a truth table indicating a write operation control corresponding to bank selection regarding the left block of FIG. 1;

FIG. 4 shows a truth table indicating a read operation control corresponding to bank selection regarding the left block of FIG. 1;

FIG. 6 is a diagram showing a truth table indicating a write operation of the double branching bidirectional buffer 10 of FIG. 5;

FIG. 7 is a diagram showing a truth table indicating a read operation of the double branching bidirectional buffer 10 of FIG. 5;

FIG. 11 is a truth table indicating a write operation control corresponding to bank selection regarding the left block of FIG. 10;

FIG. 12 is a truth table indicating a read operation control corresponding to bank selection regarding the left block of FIG. 10;

FIG. 13 is a diagram showing a truth table indicating a read operation of the double branching bidirectional buffer 10 of the second embodiment;

FIG. 19 is a diagram showing a correspondence relation between each of eight-bit I/O ports (0 to 7) and the circuit configuration of the complex logic selection buffer 22 (FIGS. 17/18);

FIGS. 22A and 22B are diagrams showing a truth table for explaining the operation of the complex logic selection buffer 22a of FIG. 21.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, two embodiments having different configurations and operations will be described respectively regarding a semiconductor memory device to which the present invention is applied.

First Embodiment

Figure 1:
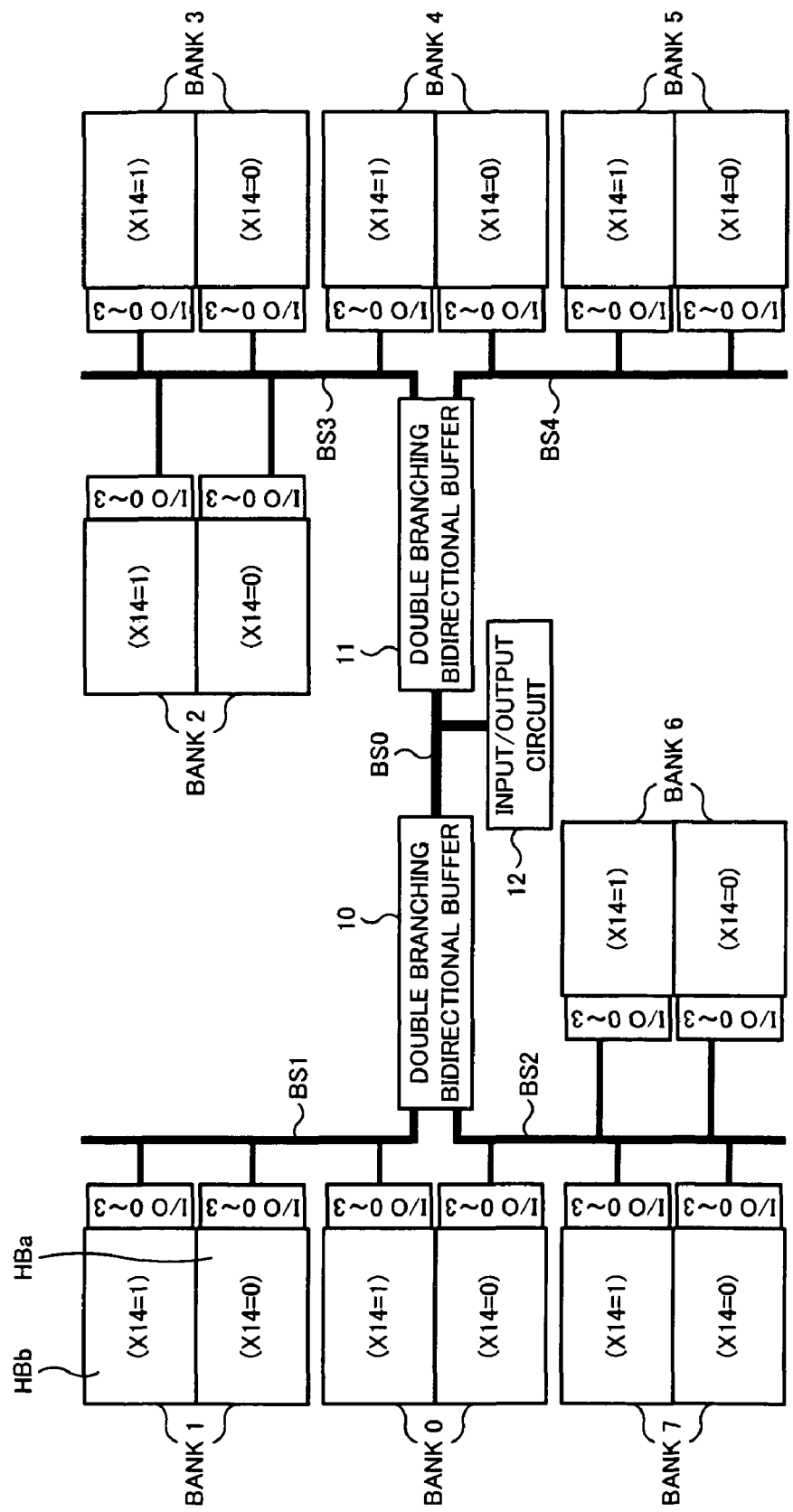
FIG. 1 is a block diagram showing a principal part of a semiconductor device of a first embodiment.

FIG. 1 is a block diagram showing a principal part of a semiconductor device of a first embodiment. For example, DDR-SDRAM (Double Data Rate-Synchronous DRAM) can be used as the semiconductor memory device of the first embodiment. The semiconductor memory device of the first embodiment includes a memory cell array divided into a plurality of banks, two double branching bidirectional buffers 10 and 11, an input/output circuit 12, a common data bus BS0, and individual data buses BS1, BS2, BS3 and BS4. FIG. 1 shows an example in which the memory cell array is divided into eight banks 0 to 7. Actually, the semiconductor memory device includes many other components, which are omitted in FIG. 1.

In FIG. 1, each of the eight banks 0 to 7 has the same capacity, and is an independently accessible storage area. Each bank includes many memory cells formed at intersections of a plurality of word lines and a plurality of bit lines. When accessing an arbitrary memory address, a bank selection signal for designating a bank, an X address for designating a word line, and a Y address for designating a bit line are required to be given respectively. In the first embodiment, each bank is partitioned into two symmetrical areas of upper and lower parts in FIG. 1 (hereinafter referred to as half bank areas HBa and HBb). Then, address information represented by the most significant bit (X14) of the X address is given to the two half bank areas HBa and HBb, and one half bank area HBa corresponds to X14=0 while the other half bank area HBb corresponds to X14=1.

Among eight banks, the banks 1, 0 and 7 are arranged in the order from the upper left side of FIG. 1, and similarly the banks 3, 4 and 5 are arranged in the order from the upper right side of FIG. 1. Also, the bank 2 is arranged at the upper center of FIG. 1, and the bank 6 is arranged at the lower center of FIG. 1. Four-bit I/O ports (0 to 3) as input/output lines are allocated to the half bank areas Hba and HBb respectively in each bank. Thus, terminals corresponding to the four-bit I/O ports (0 to 3) of each of the half bank areas HBa and HBb in each bank are connected to any of the individual data buses BS1 to BS4. As shown in FIG. 1, the bank 1 is connected to the individual data bus BS1, the banks 6 and 7 are connected to the individual data bus BS2, the banks 2 and 3 are connected to the individual data bus BS3, and the bank 5 is connected to the individual data bus BS4.

Meanwhile, two half bank areas HBa and HBb in each of the banks 0 and 4 on both sides of the center are separately connected to the individual data buses BS1 to BS4. In other words, in the bank 0, the lower half bank area HBa is connected to the individual data bus BS2 while the upper half bank area HBb is connected to the individual data bus BS1, and in the bank 4, the lower half bank area HBa is connected to the individual data bus BS4 while the upper half bank area HBb is connected to the individual data bus BS3. By this connection relation, the upper left individual data bus BS1 and the lower right individual data bus BS4 operate to transfer data whose amount corresponds to one and a half banks in the memory cell array, and the lower left individual data bus BS2 and the upper right individual data bus BS3 operate to transfer data whose amount corresponds to two and a half banks in the memory cell array.

In addition, the common data bus BS0 includes a plurality of signal lines extending in a lateral direction (first direction) in FIG. 1, and each of the individual data buses BS1 to BS4 includes a plurality of signal lines extending in a longitudinal direction (second direction) in FIG. 1. The input/output circuit 12 is connected to one end of the common data bus BS0, and data is inputted/outputted from/to outside through I/O pins.

One double branching bidirectional buffer 10 is connected to the common data bus BS0 and the individual data buses BS1 and BS2, and the other double branching bidirectional buffer 11 is connected to the common data bus BS0 and the individual data buses BS3 and BS4. These two double branching bidirectional buffers 10 and 11 buffer data transmitted bidirectionally between the common data bus BS0 and the individual data buses BS1 to BS4. As shown in FIG. 1, the overall data bus configuration has an H-shape, and the two double branching bidirectional buffers 10 and 11 are arranged at two branching points. The two double branching bidirectional buffers 10 and 11 are arranged so as to sandwich both ends of the common data bus BS0 extending in the lateral direction, and two individual data buses BS1 and BS2 (or BS3 and BS4) connected between each bank and the two double branching bidirectional buffers 10 and 11 are separated into upper and lower parts, and the respective parts extend in opposite directions. Configuration and operation of the double branching bidirectional buffers 10 and 11 will be described in detail later.

When N I/O pins for connected to outside are provided, M lines are provided corresponding to rising and falling clocks, the above I/O ports allocated for each bank and the like in the input/output circuit 12. Thus, the common data bus BS0 needs to be provided with N×M lines. Similarly, each of the individual data buses BS1 to BS4 needs to be provided with N×M lines.

In a data write operation in the semiconductor memory device, write data received from the input/output circuit 12 is transmitted through the common data bus BS0 and buffered in the bidirectional buffer 10 or 11. Then, the write data is written into a predetermined bank of the memory cell array through any of the individual data buses BS1 to BS4. In a data read operation in the semiconductor memory device, read data outputted from a predetermined bank of the memory cell array is transmitted through any of the individual data buses BS1 to BS4 and selectively buffered in the bidirectional buffer 10 or 11. Then, the read data is outputted from the input/output circuit 12 to outside through the common data bus BS0.

Figure 2:
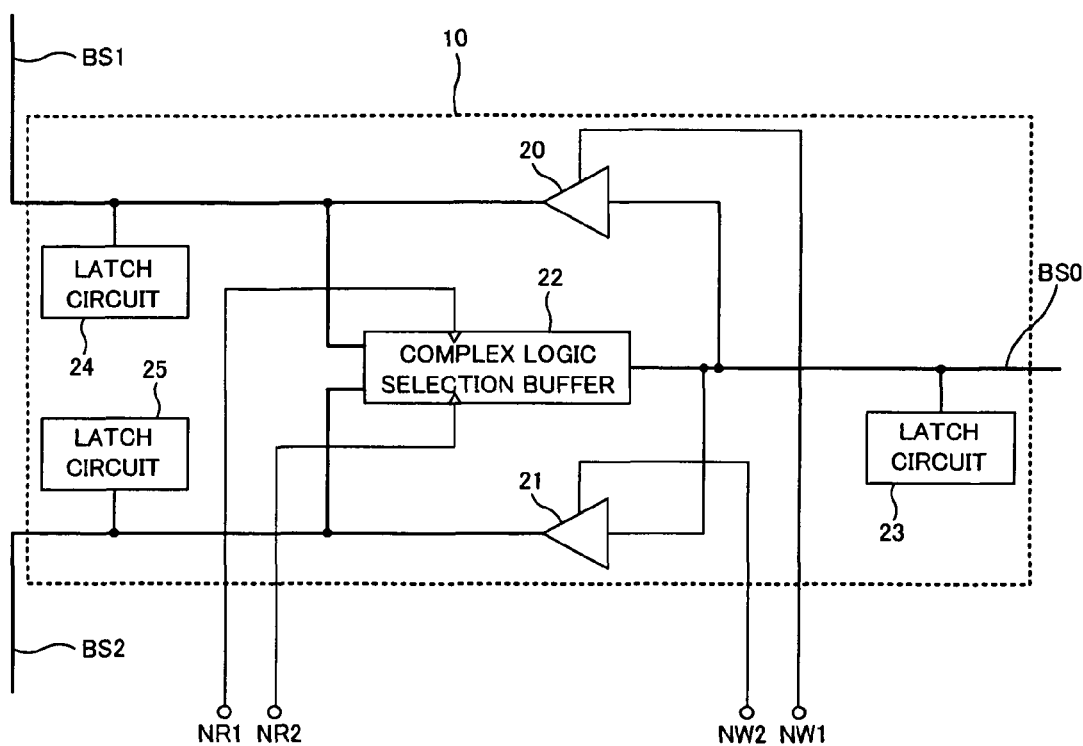
FIG. 2 is a block diagram showing a schematic configuration of a double branching bidirectional buffer 10 arranged at the left side of FIG. 1.

FIG. 2 is a block diagram showing a schematic configuration of the double branching bidirectional buffer 10 arranged at the left side of FIG. 1. Here, the double branching bidirectional buffer 11 at the right side of FIG. 1 has the same schematic configuration as that of the double branching bidirectional buffer arranged at the left side, so description thereof will be omitted. The schematic configuration shown in FIG. 2 includes two tri-state buffers 20 and 21, a complex logic selection buffer 22, and three latch circuits 23, 24 and 25. In the example of FIG. 2, each of the common data bus BS0 and the individual data buses BS1 and BS2 corresponds to a single line, however there may actually be a configuration corresponding to a plurality of lines.

One tri-state buffer 20 buffers write data transmitted through the common data bus BS0, and outputs it to the individual data bus BS1. The other tri-state buffer 21 buffers data transmitted through the common data bus BS0, and outputs it to the individual data bus BS2. A write control signal NW1 is applied to the tri-state buffer 20, and a write control signal NW2 is applied to the tri-state buffer 21. When the write control signal NW1 or NW2 are activated, a buffering operation is performed by corresponding one of tri-state buffers 20 and 21, while when the write control signal NW1 or NW2 is in a deactivated state, an output side of corresponding one of tri-state buffers 20 and 21 becomes a high impedance state. In addition, the write control signals NW1 and NW2 are generated and supplied by a control circuit (not shown).

The complex logic selection buffer 22 selectively buffers read data transmitted through two individual data buses BS0 and BS1, and outputs it to the common data bus BS0. Two read control signals NR1 and NR2 are applied to the complex logic selection buffer 22, and operation of the complex logic selection buffer 22 is controlled according to a logical combination of the read control signals NR1 and NR2. In addition, the write control signals NR1 and NR2 are generated and supplied by a control circuit (not shown).

The latch circuit 23 latches transmission data of the common data bus BS0, the latch circuit 24 latches transmission data of the individual data bus BS1, and the latch circuit 25 latches transmission data of the individual data bus BS2. These latch circuits 23, 24 and 25 have a function of continuing to latch the previous data even when the tri-state buffers 20 and 21 or the complex logic selection buffer 22 are controlled to be in a high impedance state.

In addition, detailed circuit configuration and operation of the tri-state buffers 20 and 21, the complex logic selection buffer 22 and the latch circuits 23 to 25 in FIG. 2 will be described later.

FIG. 3 shows a truth table indicating a write operation control corresponding to bank selection regarding the left block of FIG. 1. In the truth table of FIG. 3, there are shown changes of bus conditions (including address information X14) of the individual data bus BS1/BS2, the write control signals NW1 and NW2, and the read control signals NR1 and NR2, respectively, when selecting each of four banks 0, 1, 6 and 7 connected to the double branching bidirectional buffer 10.

In the write operation, one of banks 0, 1, 6 and 7 is set as a selected bank. Four kinds of bus conditions in response to two individual data buses BS0, BS1 and the value of X14 are shown for each of the banks 0, 1, 6 and 7, however two bus conditions thereof are actually valid, which are consistent with the connection relation of each bank in FIG. 1. Thus, a symbol * is appended to a column of X14 for invalid bus conditions, so that all of control signals NR1, NR2, NW1 and NW2 are set to 0.

Since FIG. 3 corresponds to the write operation control, the read control signals NR1 and NR2 are set to 0 for all conditions. Meanwhile, when focusing attention on the write control signal NW1, it is set to 1 for three conditions. This corresponds to the connection relation between the banks 0, 1 and the individual data bus BS1 in FIG. 1. Further, when focusing attention on the write control signal NW2, it is set to 1 for five conditions. This corresponds to the connection relation between banks 0, 6, 7 and the individual data bus BS2 in FIG. 1.

FIG. 4 shows a truth table indicating a read operation control corresponding to bank selection regarding the left block of FIG. 1. In the truth table of FIG. 4, there are shown changes of bus conditions (including address information X14) of the individual data bus BS1/BS2, the read control signals NR1 and NR2, and the write control signals NW1 and NW2, respectively, regarding selected four banks 0, 1, 6 and 7 similarly as in FIG. 3.

In the read operation, one of banks 0, 1, 6 and 7 is set as a selected bank similarly as in the write operation. Here, the bus conditions for the respective banks 0, 1, 6 and 7 and the meaning of the symbol * for the column of X14 are the same as in FIG. 3.

Since FIG. 4 corresponds to the read operation control, the write control signals NW1 and NW2 are set to 0 for all conditions. Meanwhile, when focusing attention on the read control signal NR1, it is set to 1 for three conditions, and when focusing attention on the read control signal NR2, it is set to 1 for five conditions. These correspond to the connection relation between the banks 0, 1, 6, 7 and the individual data bus BS1/BS2 in FIG. 1, which has been described above.

Figure 5:
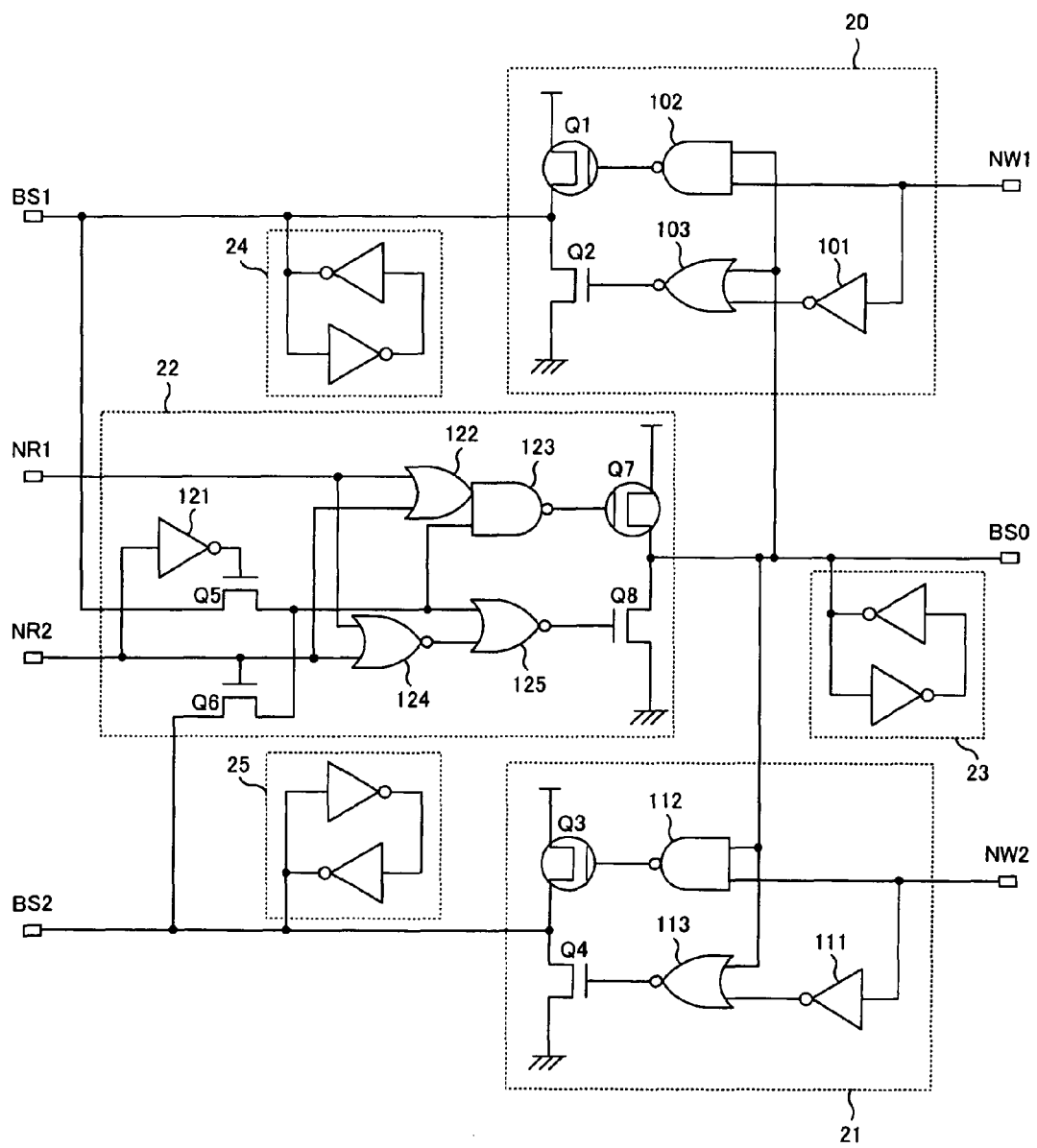
FIG. 5 is a diagram showing an example a circuit configuration corresponding to the double branching bidirectional buffer 10 of the first embodiment.

Next, the circuit configuration and operation of the double branching bidirectional buffer 10 will be described with reference to FIGS. 5 to 7. FIG. 5 shows an example of the circuit configuration corresponding to the double branching bidirectional buffer 10 in the block diagram of FIG. 2. FIG. 6 shows a truth table indicating a write operation of the double branching bidirectional buffer 10 of FIG. 5. FIG. 7 shows a truth table indicating a read operation of the double branching bidirectional buffer 10 of FIG. 5. In the truth tables of FIGS. 6 and 7, there are shown changes in states of the read control signals NR1, NR2 and the write control signal NW1, NW2, and changes in states of the common data bus BS0 and the individual data buses BS1 and BS2.

Each of three latch circuits 23, 24 and 25 is composed of a pair of inverters connected in parallel in opposite directions to each other, and latches transmission data of one node. The latch circuit 23 latches transmission data of the common data bus BS0, the latch circuit 24 latches transmission data of the individual data bus BS1, and the latch circuit 25 latches transmission data of the individual data bus BS2, respectively.

When output sides of the tri-state buffers 20, 21 and the complex logic selection buffer 22 are controlled to be in a high impedance state according to the later described control, the respective transmission data of the common data bus BS0 and the individual data buses BS1 and BS2 can be latched by the latch circuits 23 to 25.

One tri-state buffer 20 is composed of an inverter 101, a NAND gate 102, a NOR gate 103 and transistors Q1 and Q2. The common data bus BS0 is connected to one input terminal of the NAND gate 102 and one input terminal of the NOR gate 103. Further, the write control signal NW1 is applied to the other input terminal of the NAND gate 102, and the write control signal NW1 inverted by the inverter 101 is applied to the other input terminal of the NOR gate 103. An output of the NAND gate 102 is connected to the gate of the PMOS type transistor Q1, and an output of the NOR gate 103 is connected to the gate of the NMOS type transistor Q2. The transistors Q1 and Q2 are connected in series between a power supply and ground, and their intermediate node is connected to the individual data bus BS1.

When the write control signal NW1 is activated (NW1=1), the outputs of both the NAND gate 102 and the NOR gate 103 change in conjunction with the state of the common data bus BS0, thereby the transistors Q1 and Q2 on output sides are switched on/off. Thus, as shown in the truth table of FIG. 6, the state of the common data bus BS0 is outputted to the individual data bus BS1 under the condition of NW1=1. On the other hands, when the write control signal NW1 is in a deactivated state (NW1=0), the NAND gate 102 and the NOR gate 103 do not change due to the state of the common data bus BS0, and both the transistors Q1 and Q2 on the output sides are maintained off. Thus, as shown in the truth table of FIG. 6, the individual data bus BS1 becomes a high impedance state (Z) under the condition of NW1=0.

The other tri-state buffer 21 is composed of an inverter 111, a NAND gate 112, a NOR gate 113 and transistors Q3 and Q4. The circuit configuration and operation of the tri-state buffer 21 is common to those of the tri-state buffer 20 when assuming that its input side is replaced with the write control signal NW2 and its output side is replaced with the individual data bus BS2, so description thereof will be omitted.

The complex logic selection buffer 22 is composed of an inverter 121, an OR gate 122, a NAND gate 123, NOR gates 124, 125, and transistors Q5, Q6, Q7 and Q8. The read control signal NR1 is applied to one input terminal of the OR gate 122 and one input terminal of the NOR gate 124. The read control signal NR2 is applied to the other input terminal of the OR gate 122 and the other input terminal of the NOR gate 124, and is also applied to the inverter 121. The individual data bus BS1 is connected to one input terminal of the NAND gate 123 and one input terminal of the NOR gate 125 via the NMOS type transistor Q5, and also the individual data bus BS2 is connected thereto via the NMOS type transistor Q6. The read control signal NR2 is applied to the gate of the transistor Q6, and the read control signal NR2 inverted by the inverter 121 is applied to the gate of the transistor Q5.

Further, an output of the OR gate 122 is connected to the other input terminal of the NAND gate 123, and an output of the NOR gate 124 is connected to the other input terminal of the NOR gate 125. An output of the NAND gate 123 is connected to the gate of the PMOS type transistor Q7, and an output of the NOR gate 125 is connected to the gate of the NMOS type transistor Q8. The transistors Q7 and Q8 are connected in series between the power supply and ground, and their intermediate node is connected to the common data bus BS0. In addition, since the transistors Q7 and Q8 on the output sides are required to drive the common data bus BS0, transistor sizes thereof are larger than other transistors in FIG. 5.

When the read control signal NR1 is activated (NR1=1) and the read control signal NR2 is in a deactivated state (NR2=0), the transistor Q5 is turned on and the transistor Q6 is turned off. Then, one individual data bus BS1 is connected to the NAND gate 123 and the NOR gate 125, and the other individual data bus BS2 is in a non-connected state. Thereby, the transistors Q7 and Q8 on output sides are switched on/off in response to the state of the individual data bus BS1. Thus, as shown in the truth table of FIG. 7, the state of the individual data bus BS1 is outputted to the common data bus BS0 under the condition of NR1=1 and NR2=0.

Inversely, when the read control signal NR2 is activated (NR2=1) and the read control signal NR1 is in a deactivated state (NR1=0), the transistor Q5 is turned off and the transistor Q6 is turned on. Then, one individual data bus BS2 is connected to the NAND gate 123 and the NOR gate 125, and the other individual data bus BS1 is in a non-connected state. Thereby, the transistors Q7 and Q8 on the output sides are switched on/off in response to the state of the individual data bus BS2. Thus, as shown in the truth table of FIG. 7, the state of the individual data bus BS2 is outputted to the common data bus BS0 under the condition of NR2=1 and NR1=0.

Meanwhile, when the read control signals NR1 and NR2 are both in a deactivated state (NR1=0 and NR2=0), the transistors Q7 and Q8 on the output sides are both maintained off via the NAND gate 123 and the NOR gate 125 based on operation of a logic circuit. Thus, as shown in the truth table of FIG. 7, the common data bus BS0 becomes a high impedance state (Z) under the condition of NR1=NR2=0.

In contrast, a state in which both the read control signals NR1 and NR2 are activated (NR1=1 and NR2=1) needs not to be controlled. In the truth table of FIG. 7, a symbol a is appended to a column of the common data bus BS1 for such a condition so as to indicate that any state is permitted. However, the condition of NR1=NR2=1 is not necessary since the complex logic selection buffer 22 of the first embodiment can be controlled using the above three kinds of combinations.

Figures 8A, 8B:
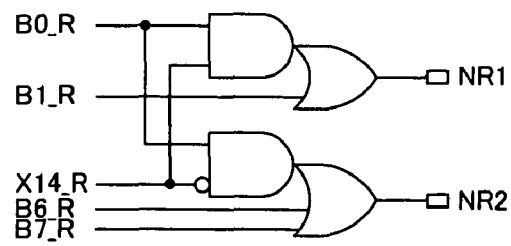
FIGS. 8A and 8B are diagrams showing a relation between a selected bank and read control signals NR1 and NR2.

Next, a relation between a selected bank and the read control signals NR1 and NR2 will be described with reference to FIGS. 8A and 8B. FIG. 8A shows a logical configuration for generating the read control signals NR1 and NR2 in the control circuit. Bank read signals B0_R, B1_R, B6_R and B7_R are signals activated when reading banks 0, 1, 6 and 7 as a selected bank, respectively. The control signal X14_R is a signal which is switched when reading one half bank area HBa (X14=0) and the other half bank area HBb (X14=1) selectively. As shown in FIG. 8A, by receiving the above signals and combining two NAND gates and two OR gates, the logic of the read control signals NR1 and NR2 can be generated.

FIG. 8B shows a truth table corresponding to the logical configuration of FIG. 8A. The read control signals NR1 and NR2 are associated with selected banks 0, 1, 6 and 7 so that one of the control signals NR1 and NR2 is 1 and the other thereof is 0 in response to the respective connection relations (FIG. 1) between the half bank areas HBa, HBb (X14=0/1) and the individual data buses BS1, BS2. In this case, different read control signals NR1 and NR2 are associated with two half bank areas HBa and HBb only for the bank 0. Further, the read control signals NR1 and NR2 do not change in response to a value of X=14 for other selected banks.

Figure 9:
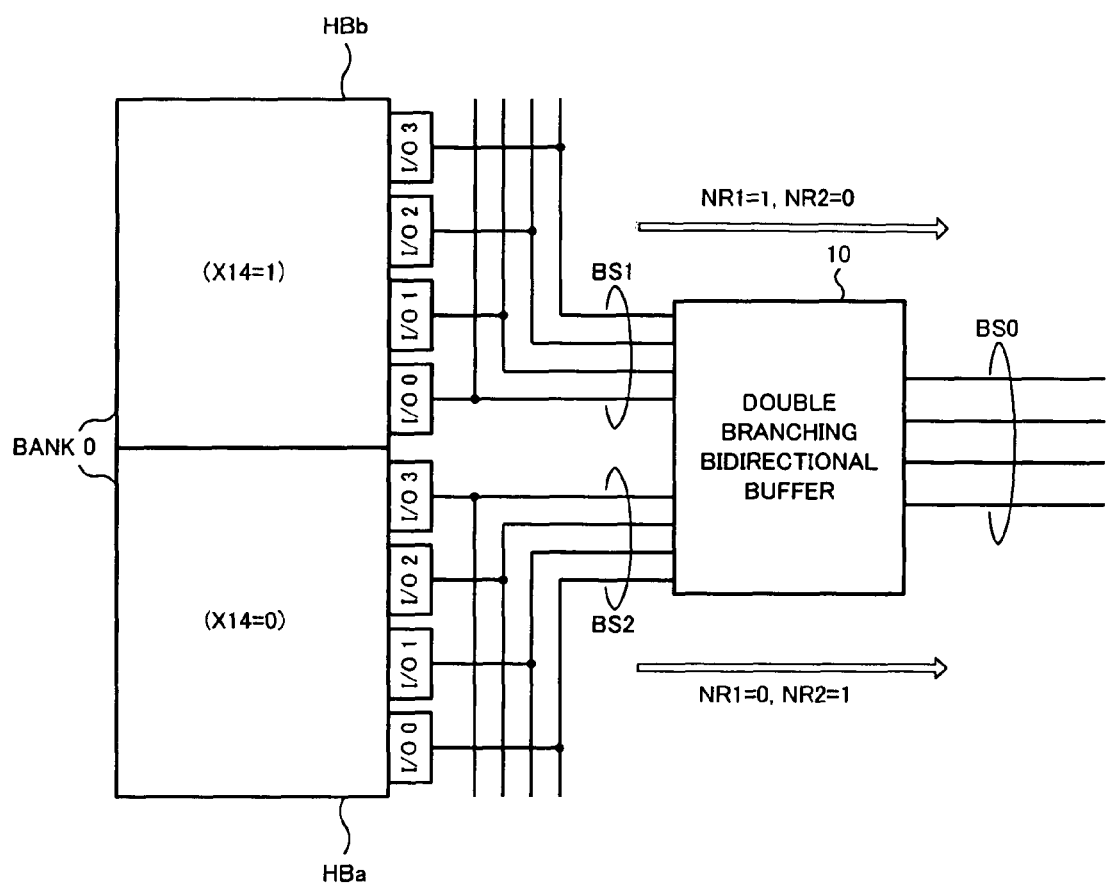
FIG. 9 is a diagram showing a detailed configuration of an area in the vicinity of the bank 0 and the individual data buses BS1 and BS2 in the configuration of FIG. 1 regarding a read operation o the bank 0.

FIG. 9 shows a detailed configuration of an area in the vicinity of the bank 0 and the individual data buses BS1 and BS2 in the configuration of FIG. 1 by focusing attention on the read operation of the bank 0. In FIG. 9, terminals represented as the I/O ports (0 to 3) are connected to four lines in each of the half bank areas HBa and HBb in the bank 0. The upper half bank area HBb is connected to four lines of the individual data bus BS1, and the lower half bank area HBa is connected to four lines of the individual data bus BS2. Then, when the state of X14=1, NR1=1 and NR2=0 is controlled, four-bit read data of the half bank area HBb is buffered in the double branching bidirectional buffer 10 through the individual data bus BS1, and thereafter transmitted to the common data bus BS0. Further, when the state of X14=0, NR1=0 and NR2=1 is controlled, four-bit read data of the half bank area HBa is buffered in the double branching bidirectional buffer 10 through the individual data bus BS2, and thereafter transmitted to the common data bus BS0.

As described above, since the common data bus BS0 and the individual data buses BS1 to BS0 are separately provided using the bidirectional buffers 10 and 11 by employing the data bus configuration of the first embodiment, wiring length of the data bus between the memory cell array and the input/output circuit 12 can be shortened, so that delay of data transmission can be prevented. Then, since the common data bus BS0 is shared by the individual data buses BS1 to BS4 for connecting between banks 0 to 7 of the memory cell array and the bidirectional buffers 10 and 11, correspondingly the number of wirings can be reduced and the number of circuit elements can be also reduced. Further, each bank, which is assumed to be partitioned into two half bank areas HBa and HBb, can be selectively connected to a desired one of the individual data buses BS1 to BS4 corresponding to the arrangement of each bank by controlling using address information (X14). Particularly, regarding banks 0 and 4 at the center, the two half bank areas HBa and HBb can be connected to different individual data buses BS1 to BS4 from each other. Therefore, the individual data buses BS1 and BS3 are arranged on one side (upper side) and the individual data buses BS2 and BS4 are arranged on the other side (lower side), with reference to positions of the bidirectional buffers 10 and 11, so that data bus configuration optimal for the arrangement of the banks 0 to 7 can be achieved.

Second Embodiment

Figure 10:
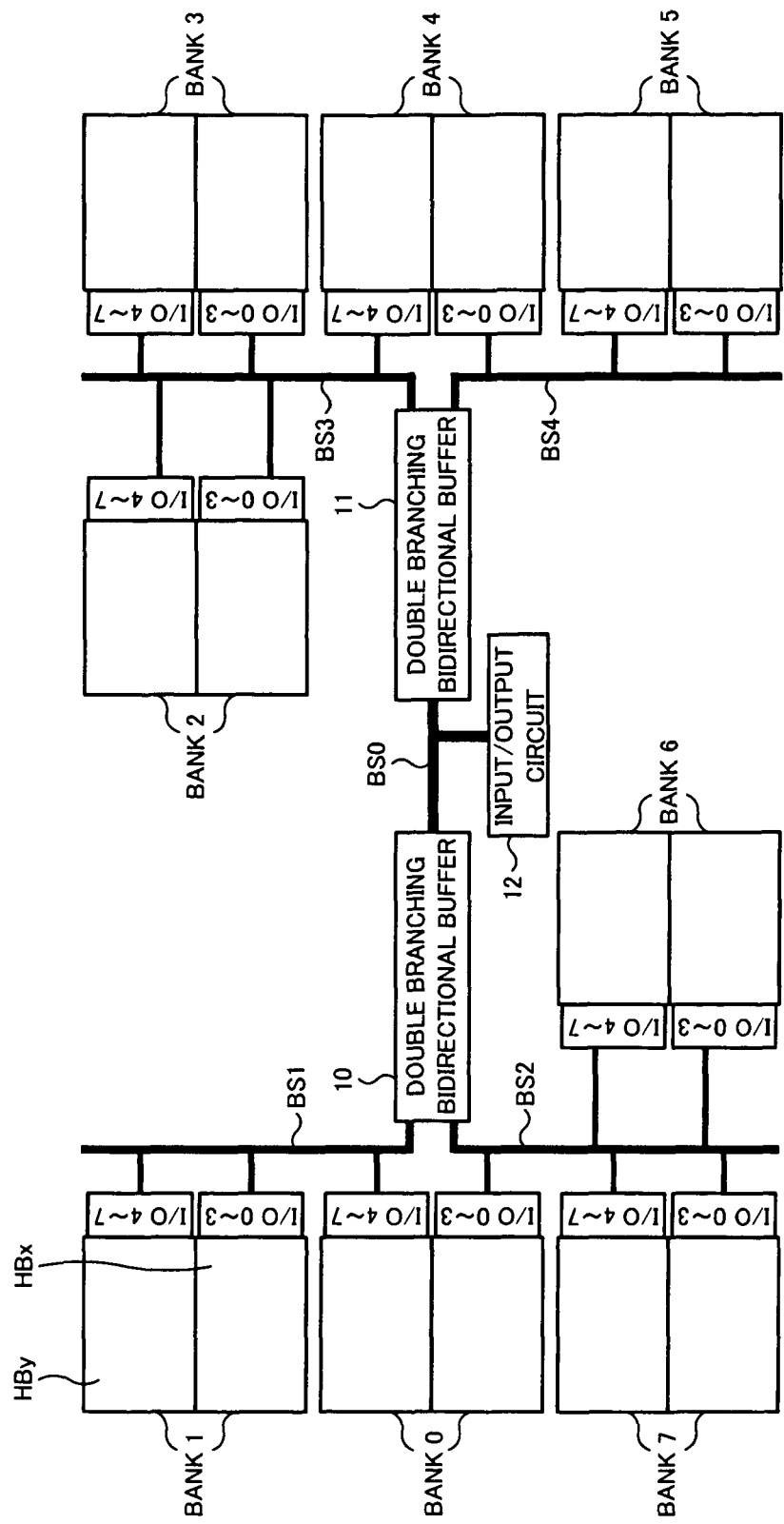
FIG. 10 is a block diagram showing a principal part of a semiconductor device of a second embodiment.

FIG. 10 is a block diagram showing a principal part of a semiconductor device of a second embodiment. In the second embodiment, since basic components of the semiconductor memory device are common to those in the first embodiment, description of the components having the same numbers as those in FIG. 1 will be omitted. When comparing the second embodiment with the first embodiment, each of eight banks 0 to 7 is partitioned into half bank areas HBx and HBy of upper and lower parts, however a difference exists in that the address information (X14) is not given to the half bank areas HBx and HBy. For example, a case is assumed where the X address is used for other purposes and is not assigned to the address information in each bank. Meanwhile, I/O ports (0 to 3) as four-bit input/output lines are allocated to the lower half bank area HBx, and I/O ports (4 to 7) as the other four-bit input/output lines are allocated to the upper half bank area HBy, respectively, in each bank. Thus, each individual bank is associated with eight-bit I/O ports (0 to 7) in total, the number of I/O ports is twice that in the first embodiment.

The configuration of the double branching bidirectional buffer 10 shown in FIG. 2 is also applied to the second embodiment. In this case, since X14 is not given to each of half bank areas HBx and HBy in the second embodiment as mentioned above, an operation control should be performed differently from that in FIG. 3. FIG. 11 shows a truth table indicating a write operation control corresponding to bank selection regarding the left block of FIG. 10. In the truth table of FIG. 11, there are shown changes of settings of the individual data bus BS1/BS2, the read control signals NR1 and NR2 and the write control signals NW1 and NW2, respectively, when selecting each of four banks 0, 1, 6 and 7 connected to the double branching bidirectional buffer 10.

A case in which a priority order is set for the bank 0 is shown, in addition to cases in which the banks 0, 1, 6 and 7 are set as selected banks respectively in the write operation. Since FIG. 11 corresponds to the write operation control, the read control signals NR1 and NR2 are set to 0 under all conditions. Further, when the priority order is not set, changes of the write control signals NW1 and NW2 correspond to the connection relation between each bank and the individual data bus BS1/BS2 in FIG. 10.

Meanwhile, in the second embodiment, a control for setting both the write control signals NW1 and NW2 to 1 is permitted, and the write operation control for one of the half bank areas HBx and HBy in the bank 0 is enabled in accordance with a preset priority order for the individual data buses BS1 and BS2. The setting of the priority order is clearly indicated only for the bank 0, and this is because the respective half bank areas HBx and HBy are configured to be separately connected to the individual data buses BS1 and BS2, as different from other banks 1, 6 and 7.

FIG. 12 shows a truth table indicating a read operation control corresponding to bank selection regarding the left block of FIG. 10. In the truth table of FIG. 12, there are shown changes of settings of the individual data bus BS1/BS2, the read control signals NR1 and NR2, and the write control signals NW1 and NW2, respectively, regarding the four banks 0, 1, 6 and 7 similarly as in FIG. 11.

A case in which the above-mentioned priority order is set for the bank 0 is shown, in addition to cases in which the banks 0, 1, 6 and 7 are set as selected banks respectively in the read operation. Since FIG. 12 corresponds to the read operation control, the write control signals NW1 and NW2 are set to 0 under all conditions. Further, when the priority order is not set, changes of the read control signals NR1 and NR2 correspond to the connection relation between each bank and the individual data bus BS1 in FIG. 10.

In FIG. 12, a control for setting both the read control signals NR1 and NR2 to 1 is permitted, and the read operation control for one of the half bank areas HBx and HBy in the bank 0 is enabled in accordance with a preset priority order for the individual data buses BS1 and BS2, similarly as the write control signals NW1 and NW2 in FIG. 12. The priority order is set only for the bank 0 based on the same reason as the write operation control.

Next, a read operation of the double branching bidirectional buffer 10 of the second embodiment will be described. Here, the circuit configuration of the double branching bidirectional buffer 10 is the same as that of the first embodiment in FIG. 5. FIG. 13 shows a truth table indicating the read operation of the double branching bidirectional buffer 10. In FIG. 13, there are shown changes in states of the read control signals NR1, NR2 and the write control signal NW1, NW2, and changes in states of the common data bus BS0 and the individual data buses BS1 and BS2, similarly as in FIG. 7 for the first embodiment.

Regarding the read control signals NR1 and NR2, a condition of NR1=0, NR2=0, a condition of NR1=1, NR2=0, and a condition of NR1=0, NR2=1 change in the same manner as in FIG. 7. On the other hand, a state in which both the read control signals NR1 and NR2 are activated (NR1=1 and NR2=1) is different from FIG. 7. That is, the read priority order is set so that the individual data bus BS2 is given priority over the individual data bus BS1 in the example of FIG. 13, and therefore the above condition can be interpreted as being the same as NR1=0 and NR2=1. Accordingly, a control is performed so that the individual data bus BS2 is connected to the common data bus BS0 through the double branching bidirectional buffer 10.

In addition, contrary to the example of FIG. 13, the read priority order may be set so that the individual data bus BS1 is given priority over the individual data bus BS2. In this case, the condition of NR1=1 and NR2=1 can be interpreted as the condition of NR1=1 and NR2=0. Further, the above priority order may not be set so that operation without using the condition of NR1=1 and NR2=1 may be controlled, like in the first embodiment.

Next, a relation between a selected bank and the read control signals NR1 and NR2 will be described with reference to FIGS. 14A to 14C, 15A and 15B. In the following description, a case where the above priority order is not set (FIGS. 14A to 14C) will be compared with a case where the above priority order is set (FIGS. 15A and 15B). The read control signals NR1 and NR2 for the case where the priority order is not set are assumed to be divided into control signals NR1$a$, NR2$a$ for the I/O ports (4 to 7) and control signals NR1$b$, NR2$b$ for the I/O ports (0 to 3).

Figures 14A, 14B, 14C:
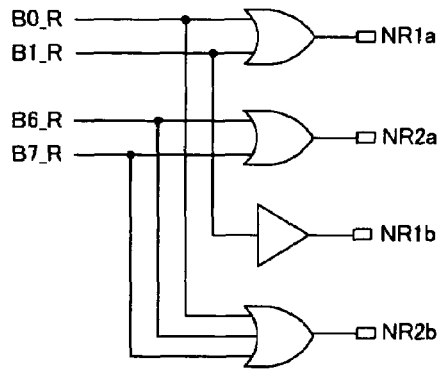
FIGS. 14A, 14B and 14C are diagrams showing a relation between a selected bank and read control signals NR1 and NR2 b for a case where a priority order is not set.
Figures 15A, 15B:
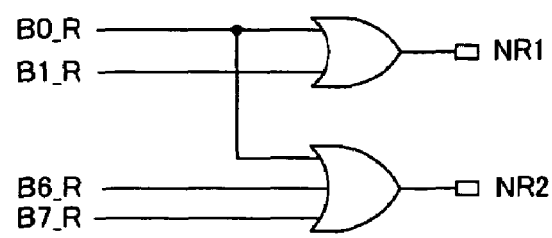
FIGS. 15A and 15B are diagrams showing a relation between a selected bank and read control signals NR1 and NR2 b for a case where a priority order is set.

FIG. 14A shows a logical configuration for generating the four read control signals NR1$a$, NR2$a$, NR1$b$ and NR2$b$ for the case where the priority order is not set. Three OR gates and an inverter are arranged in parallel and receive the bank read signals B0_R, B1_R, B6_R and B7_R as in FIG. 8 with a predetermined combination. FIG. 14B shows a truth table for the I/O ports (4 to 7), and FIG. 14C shows a truth table for the I/O ports (0 to 3), respectively, corresponding to the logical configuration of FIG. 14A. When comparing FIG. 14B with FIG. 14C, the same logic is applied for banks other than the bank 0 while the reverse logic is applied for the bank 0, reflecting the connection relation of FIG. 10.

FIG. 15A shows a logical configuration for generating the read control signals NR1 and NR2 for the case where the priority order is set. Two OR gates receives the bank read signals B0_R, B1_R, B6_R and B7_R as in FIG. 14A with a predetermined combination. FIG. 15B shows a truth table corresponding to the logical configuration of FIG. 15A. The logic applied for banks other than the bank 0 is the same as in FIGS. 14B and 14C while a condition of NR1=1 and NR2=1 is set for the bank 0 so as to operate in accordance with the priority order. In this manner, the logical configuration for the case where the priority order is set in FIG. 15A is simpler than the logical configuration for the case where the priority order is not set in FIG. 14A, thereby reducing the number of signal lines.

Figure 16:
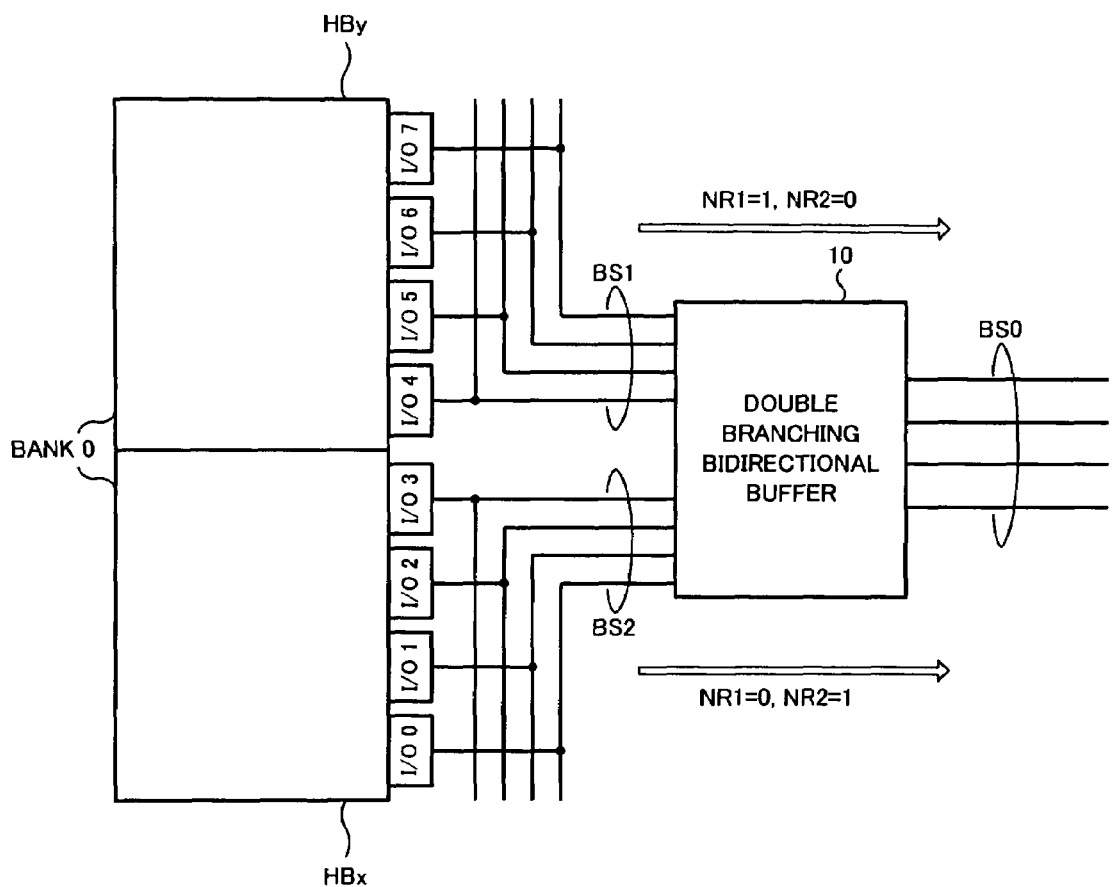
FIG. 16 is a diagram showing a detailed configuration of an area in the vicinity of the bank 0 and the individual data buses BS1 and BS2 in the configuration of FIG. 1 regarding a read operation o the bank 0 in the second embodiment.

Here, attention is focused on a read operation for the bank 0 when the priority order is set, and FIG. 16 shows a detailed configuration like in FIG. 9. In FIG. 16, terminals represented as the I/O ports (0 to 7) are connected to eight lines in each of the half bank areas HBx and HBy in the bank 0. The I/O ports (4 to 7) of the upper half bank area HBy are connected to four lines of the individual data bus BS1, and the I/O ports (0 to 3) of the lower half bank area HBx are connected to four lines of the individual data bus BS2. Then, when the condition of NR1=1 and NR2=0 is controlled, four-bit read data of the half bank area HBx is buffered in the double branching bidirectional buffer 10 through the individual data bus BS1, and thereafter transmitted to the common data bus BS0. Further, when the condition of NR1=0 and NR2=1 is controlled, four-bit read data of the half bank area HBx is buffered in the double branching bidirectional buffer 10 through the individual data bus BS2, and thereafter transmitted to the common data bus BS0. Furthermore, when the condition of NR1=1 and NR2=1 is controlled, four-bit read data of one of the half bank areas HBx and HBy is buffered in the double branching bidirectional buffer 10 through one of the individual data buses BS1 and BS2, and thereafter transmitted to the common data bus BS0.

Figure 17:
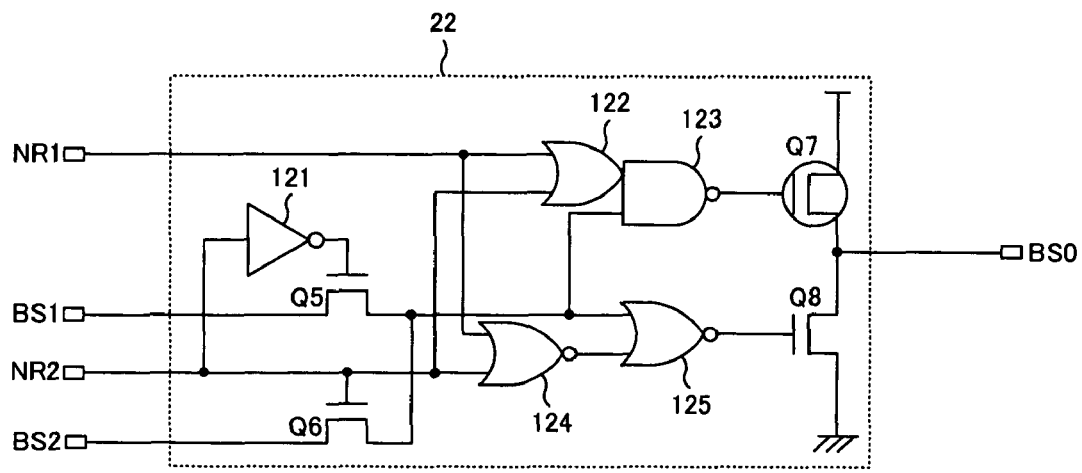
FIG. 17 is a diagram showing a circuit configuration (Configuration A) of a complex logic selection buffer 22 when the individual data bus BS2 is given priority for the condition of NR1=1 and NR2=1 in the second embodiment.
Figure 18:
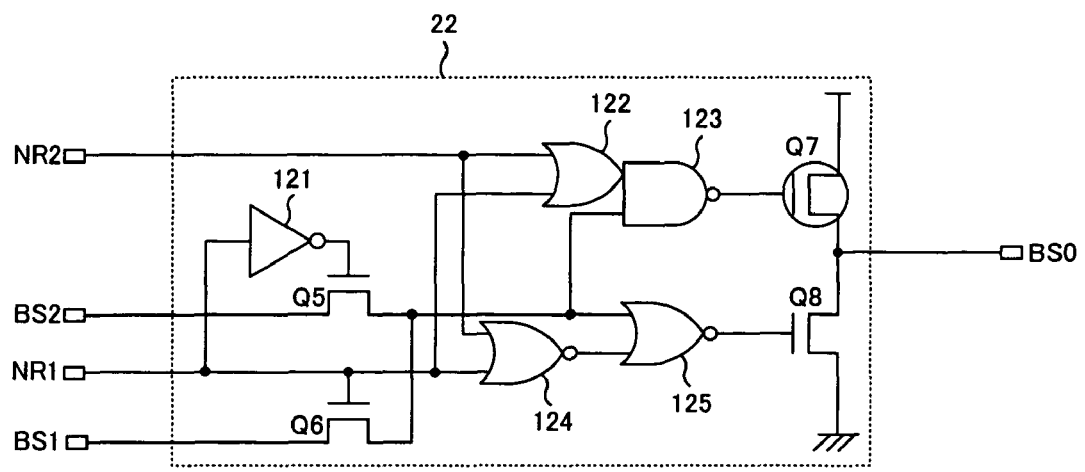
FIG. 18 is a diagram showing a circuit configuration (Configuration B) of the complex logic selection buffer 22 when the individual data bus BS1 is given priority for the condition of NR1=1 and NR2=1 in the second embodiment.

Next, the circuit configuration and operation of the complex logic selection buffer 22 corresponding to the setting of the priority order will be described with reference to FIGS. 17 to 19. Configuration A shown in FIG. 17 is a circuit configuration of the complex logic selection buffer 22 when the individual data bus BS2 is given priority for the condition of NR1=1 and NR2=1. Further, Configuration B shown in FIG. 18 is a circuit configuration of the complex logic selection buffer 22 when the individual data bus BS1 is given priority for the setting of NR1=1 and NR2=1. The configuration A of FIG. 17 is common to the circuit configuration of the complex logic selection buffer 22 in FIG. 5. On the other hand, the configuration B of FIG. 18 is such that nodes of the read control signals NR1 and NR2 of FIG. 17 are replaced with each other and nodes of the individual data buses BS1 and BS2 of FIG. 17 are replaced with each other.

First, a state of NR1=1 is controlled in the configuration A of FIG. 17 will be considered. In this case, when NR2=0, the transistor Q5 is turned on so that data of the individual data bus BS1 is buffered. However, when NR2=1, the transistor Q5 is turned off so that the path of the individual data bus BS1 is blocked, and thus the transistor Q6 is turned on so that the individual data bus BS2 is buffered. In this manner, since the transistors Q5 and Q6 are controlled to be on/off by the read control signal NR2, the individual data bus BS2 is given priority.

Further, in the configuration B of FIG. 18, since the nodes of FIG. 17 are replaced as described above, the individual data bus BS1 is given priority, contrary to FIG. 17. That is, when the condition of NR1=1 and NR2=1 is set, the transistor Q5 is turned off so that the path of the individual data bus BS2 is blocked, and thus the transistor Q6 is turned on so that data of the individual data bus BS1 is buffered.

FIG. 19 shows a correspondence relation between each of eight-bit I/O ports (0 to 7) and the circuit configuration of the complex logic selection buffer 22 (FIGS. 17/18). The configuration A of FIG. 17 is used for lower 4 bits (0 to 3) of the I/O ports, and the data transfer direction is from the individual data bus BS2 to the common data bus BS0 when the condition of NR1=1 and NR2=1 is set. Thereby, when the bank 0 of FIG. 10 is selected, data of the half bank area HBx can be outputted through the individual data bus BS2. Meanwhile, the configuration B of FIG. 18 is used for upper 4 bits (4 to 7) of the I/O ports, and the data transfer direction is from the individual data bus BS1 to the common data bus BS0 when the condition of NR1=1 and NR2=1 is set. Thereby, when the bank 0 of FIG. 10 is selected, data of the half bank area HBy can be outputted through the individual data bus BS1.

As described above, by employing the data bus configuration of the second embodiment, it is possible to achieve the same basic function and effect as the first embodiment. In addition to this, since the priority order is set for the case where the address information is not given to the half bank areas Hbx and Hby in each bank of the memory cell array, the second embodiment enables a selective connection to the individual data buses BS1 to BS4 with a desired combination, by permitting the control in which the write control signals conflict with each other.

In the above-described embodiments, the configuration in which the bidirectional buffer 10 (11) is connected to one common data bus BS0 and two individual data buses BS1 and BS2 (BS3 and BS4) has been shown, however the present invention is not limited to this configuration. In the following, a configuration including the bidirectional buffer having more branching points will be described as a modification of the embodiments.

Figure 20:
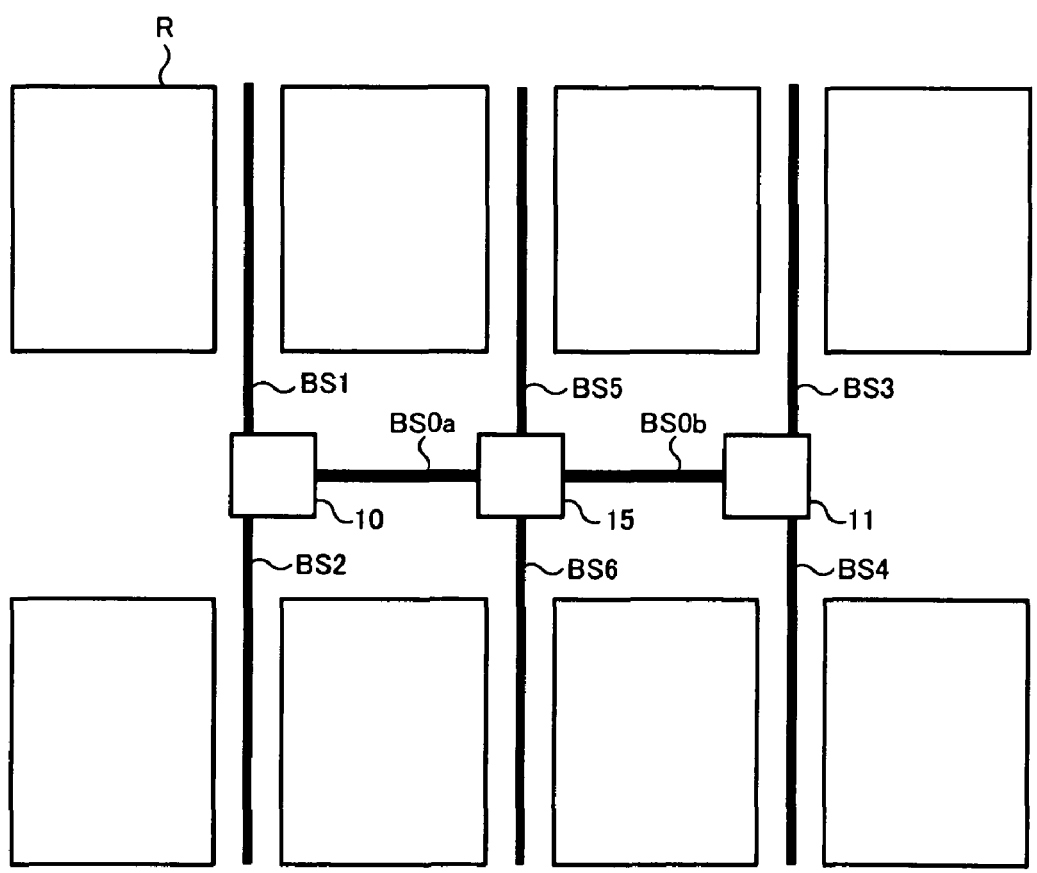
FIG. 20 is a block diagram showing a schematic configuration of a modification of the embodiments.

FIG. 20 is a block diagram showing a schematic configuration of the modification of the embodiments. A semiconductor memory device of this modification includes a memory cell array divided into eight areas R, two double branching bidirectional buffers 10 and 11, a triple branching bidirectional buffer 15, two common data buses BS0a and BS0b and six individual data buses BS1 to BS6. Here, other components are omitted in FIG. 20.

In the configuration of FIG. 20, it differs from the configuration of FIG. 1 in that the common data bus BS0 in FIG. 1 is separated into two common data buses BS0a and BS0b via the triple branching bidirectional buffer 15, and that the two individual data buses BS5 and BS6 connected to the triple branching bidirectional buffer 15 are added. This configuration is employed because the triple branching bidirectional buffer 15 connected to paths extending in four directions needs to be arranged at the center in order to arrange the individual data buses BS0 to BS6 between adjacent areas R. For example, when assuming that the input/output circuit 12 is connected to one common data bus BS0b, the operation of the triple branching bidirectional buffer 15 is performed so as to buffer data transmitted bidirectionally between the common data bus BS0b and three buses including the common data bus BS0a and the individual data buses BS5, BS6.

Figure 21:
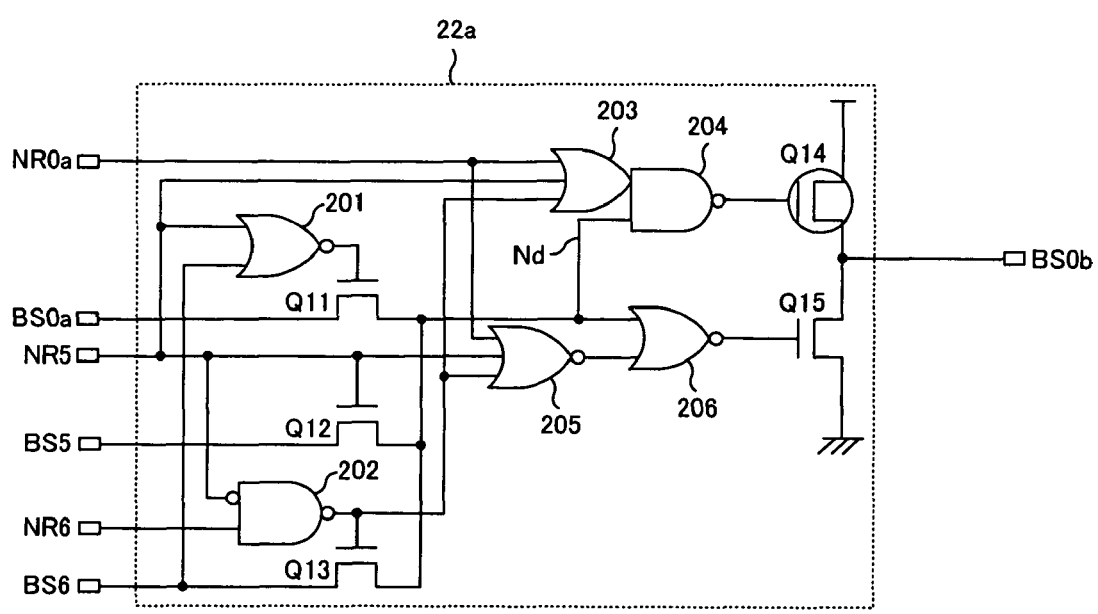
FIG. 21 is a diagram showing a circuit configuration of a complex logic selection buffer 22a included in a triple branching bidirectional buffer 15 of FIG. 20.

FIG. 21 shows a circuit configuration of a complex logic selection buffer 22a included in the triple branching bidirectional buffer 15 of FIG. 20. The complex logic selection buffer 22a shown in FIG. 20 includes a NOR gate 201, NAND gates 202 and 204, an OR gate 203, NOR gates 205 and 206, and transistors Q11, Q12, Q13, Q14 and Q15. Among these, the OR gate 203, the NAND gate 204, the NOR gates 205 and 206, and the transistors Q11, Q12, Q14 and Q15 correspond to the OR gate 122, the NAND gate 123, the NOR gates 124 and 125, and the transistors Q5, Q6, Q7 and Q8 in FIG. 5. Further, in FIG. 21, the inverter 121 of FIG. 5 is replaced with the NOR gate 201, and the NAND gate 202 and the transistor Q13 are added. Furthermore, in FIG. 21, respective nodes of the common data bus BS0, the individual data buses BS1 and BS2, and the read control signals NR1 and NR2 in FIG. 5 are replaced with nodes of the common data buses BS0a and BS0b, the individual data bus BS5, and the read control signals NR0a and NR5, and nodes of the individual data bus BS6 and the read control signal NR6 are added.

FIG. 22 shows a truth table for explaining the operation of the complex logic selection buffer 22a of FIG. 21. FIG. 22A shows states of node Nd (FIG. 21) and FIG. 22B shows data transfer directions of the complex logic selection buffer 22a, respectively, for states of the read control signals NR0x, NR5 and NR6. The circuit configuration of FIG. 21 is an example in which the priority order is set in accordance with the order of the individual data buses BS5, BS6 and the common data bus BS0a. Thus, when the combination of the read control signals NR0x, NR5 and NR6 is such that two or more of them are 1 in FIG. 22A, the node Nd does not change to a high impedance state and changes in accordance with the priority order. As shown in FIG. 22B, the data transfer corresponding to the state of FIG. 22A is performed.

In addition, a case of using the triple branching bidirectional buffer 15 has been described in the above the modification, however a bidirectional buffer having branches to a larger number of data buses may be employed. In this case, the circuit scale of the bidirectional buffer increases, however read and write operations can be controlled in the same manner, and, the priority order can be set for the larger number of data buses.

It is apparent that the present invention is not limited to the above embodiments, but may be modified and changed without departing from the scope and spirit of the invention.

What is claimed is:

1. A semiconductor memory device comprising:
a memory cell array divided into a plurality of areas;
a common data bus connected to an input/output circuit;
a plurality of individual data buses connected to different areas of said memory cell array through different paths respectively; and
a double branching bidirectional buffer connected to said common data bus and a predetermined number of said individual data buses and buffering data transmitted bidirectionally between said common data bus and a selected one of the predetermined number of said individual data buses.

2. The semiconductor memory device according to claim 1, wherein said common data bus includes a plurality of signal lines extending in a first direction, and each of said individual data buses includes a plurality of signal lines extending in a second direction orthogonal to the first direction.

3. The semiconductor memory device according to claim 1, wherein said bidirectional buffer is a double branching bidirectional buffer for buffering data transmitted bidirectionally between a selected one of a first and second individual data buses and said common data bus.

4. The semiconductor memory device according to claim 3, wherein the first individual data bus is arranged on one side in the second direction, and the second individual data bus is arranged on another side in the second direction respectively based on a position of said double branching bidirectional buffer.

5. The semiconductor memory device according to claim 4, wherein two said double branching bidirectional buffers are arranged so as to sandwich both ends of said common data bus.

6. The semiconductor memory device according to claim 4, wherein said memory cell array is divided into a plurality of banks and each of the banks is partitioned into a first area and a second area,
and the plurality of banks includes a bank having the first and second areas both of which are connected to the first individual data bus, a bank having the first and second areas both of which are connected to the second individual data bus, and a bank having the first area connected to the first individual data bus and having the second area connected to the second individual data bus.

7. The semiconductor memory device according to claim 6, wherein address information for selecting the first and second areas is given to the plurality of banks, and common input/output lines are allocated to the respective first and second areas in the plurality of banks.

8. The semiconductor memory device according to claim 7, wherein different input/output lines are allocated to the respective first and second areas in the plurality of banks.

9. The semiconductor memory device according to claim 1, wherein said bidirectional buffer comprises:
a plurality of tri-state buffers for buffering write data transmitted through said common data bus and for outputting the write data to each of the plurality of said individual data buses;
a complex logic selection buffer for selectively buffering read data transmitted through the plurality of said individual data buses and for outputting the read data to said common data bus; and
a plurality of latch circuits for latching respective transmission data of the plurality of said individual data buses and said common data bus.

10. The semiconductor memory device according to claim 9, wherein the plurality of tri-state buffers are controlled in response to write control signals different from one another, the write data of said common data bus is buffered when a corresponding one of the write control signals is activated, and an output side of each of the tri-state buffers becomes a high impedance state when the write control signal is in a deactivated state.

11. The semiconductor memory device according to claim 9, wherein the complex logic selection buffer is controlled in accordance with a logical combination of a plurality of read control signals, and selectively buffers the read data of a corresponding one of the predetermined number of said individual data buses when the read control signal is activated.

12. The semiconductor memory device according to claim 11, wherein the complex logic selection buffer selectively buffers the read data of one of said individual data buses which is selected in accordance with a priority order set for the plurality of said individual data buses when two or more of the read control signals are activated.

* * * * *